April 26, 1960 R. B. CORBIN Re. 24,815

CRYSTAL OVEN

Original Filed Dec. 12, 1955

INVENTOR.
Robert B. Corbin
BY Mueller & Aichele
Attys.

United States Patent Office

Re. 24,815
Reissued Apr. 26, 1960

24,815

CRYSTAL OVEN

Robert B. Corbin, Oak Park, Ill., assignor to Motorola, Inc., Chicago, Ill., a corporation of Illinois Original No. 2,846,596, dated August 5, 1958, Serial No. 552,546, December 12, 1955. Application for reissue May 28, 1959, Serial No. 816,649

6 Claims. (Cl. 219—19)

Matter enclosed in heavy brackets [ ] appears in the original patent but forms no part of this reissue specification; matter printed in italics indicates the additions made by reissue.

This invention relates to piezo-electric crystals and more particularly to a housing and oven for such crystals.

Piezo-electric crystals are often used for frequency regulation in electronic circuits and in such capacity these crystals must provide stable operation at their rated frequencies. Since change in the temperature of a crystal generally has substantial influence on its frequency characteristics, it is common to enclose a crystal device in a housing in which the temperature is regulated. One method of temperature regulation is in the use of an electric heater controlled by a thermostat to maintain the temperature of a housing for the crystal substantially constant. Such a temperature would conveniently be above the highest ambient temperature likely to be encountered around the equipment in which the crystal is used, thereby insuring that the heating apparatus will always be capable of holding the crystal at a selected constant temperature so that its frequency characteristics likewise remain constant.

An object of this invention is to provide piezo-electric crystal heating apparatus which is of simple and inexpensive construction.

Another object is to provide crystal oven and housing apparatus which requires but few component parts and which maintains a crystal closely within desired temperature limits, as regulated by a sealed thermostat.

Another object of the invention is to provide a crystal oven which may be easily disassembled for expedient replacement or repair of the enclosed component parts.

A feature of the invention is the provision of crystal heating and housing apparatus including an inner housing supported in an outer housing and a partition in the inner housing defining a crystal chamber and a thermostat chamber, with a heating coil adjacent the crystal chamber and controlled by the thermostat.

Another feature is the provision of a rectangular crystal oven comprising a retangular housing with lug portions thereof supporting a crystal socket, which socket defines a chamber for one or more crystals as well as a chamber for a hermetically sealed thermostat used to regulate the heating of the oven.

Another feature of the invention is the provision of an inner housing containing a thermostatically controlled electric heater and a crystal which housing is retained on ledge portions in a plug type base by a bracket or suitable adhesive. An outer housing secured to the base encloses the inner housing and shields the unit against undue heat loss.

Further objects, features and the attending advantages thereof will be apparent upon consideration of the following description when taken in conjunction with the accompanying drawings in which.

Figure 1:
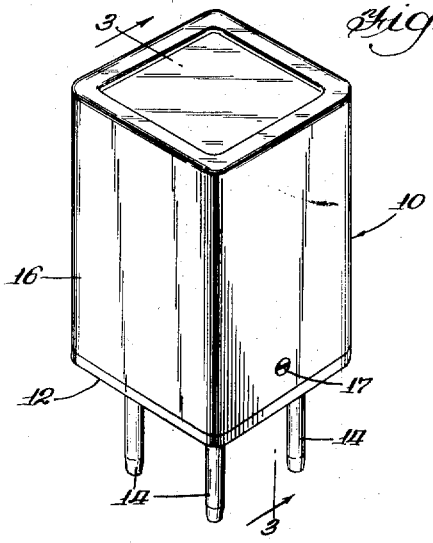
Fig. 1 is a perspective view of the assembled crystal housing and oven.

This invention provides a housing and oven for piezo-electric crystals to maintain one or more such crystals at a substantially constant temperature. A rectangular inner housing having a thermostat in the bottom thereof is used to enclose a crystal socket supported by punched out portions of such housing so that the socket defines a crystal chamber and a thermostat chamber. Heating of this housing is effected by an electrical coil wrapped thereabout in a position adjacent the crystal chamber. Current to the coil is regulated by the thermostat. The inner housing is supported by means of a bracket on ledge portions of a pinned connector base. The inner housing may also be retained by cement or adhesive and the wire leads thereto. An outer housing fastened to the connector base completely encloses the entire apparatus. The outer housing is detachable from the base and a removable cover on the inner housing permits access to the enclosed crystal when such is necessary. The rectangular shape of the inner housing permits a large crystal to be contained therein if it extends diagonally across the housing. Alternatively a plurality of smaller crystals may be contained within the housing in positions parallel with the walls thereof.

The crystal housing and oven 10 shown in the drawing includes a base 12 composed of insulating material and having connecting pins 14 extending therefrom. An outer housing 16, rectangular in shape, is secured to the base 12 by means of screws 17 and the base 12 is recessed so that outer housing 16 will fit snugly thereabout.

Figure 3:
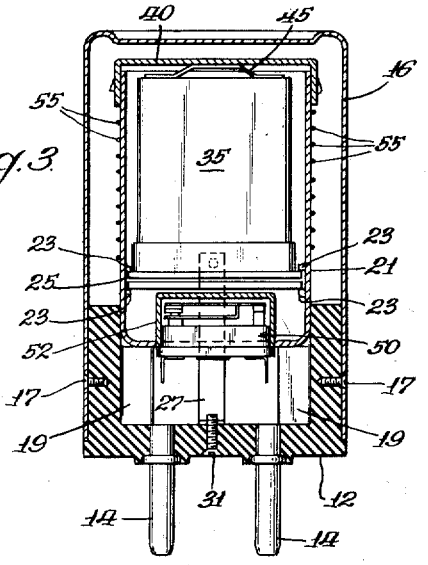
Fig. 3 is a sectional view along the line 3—3 of Fig. 1.

Base 12 includes a rectangular opening into which ledge portions 19, integral with the base, extend for the purpose of supporting inner rectangular housing 21. Portions 19 terminate short of the top side of the base so that housing 21 may be firmly retained in the rectangular opening in the base (Fig. 3). Housing 21 includes a pair of opposing inwardly bent lugs 23 in each face thereof in order to retain the partition or socket 25 firmly within the housing. The U-shaped bracket 27 encircles the bottom of housing 21 and inwardly bent lugs 29 on opposite arms of bracket 27 extend in to the upper recesses formed by a pair of the opposing lugs 23. The bottom side of U-shaped bracket 27 contains a tapped aperture so that the housing 21 may be secured to the base 12 by means of a bolt 31 extending up through the bottom of the base. As an alternative a suitable cement or adhesive may secure housing 21 to portions 19.

Socket 25 includes electrical connectors 33 (Fig. 2) into which the terminal prongs of piezo-electric crystal 35 may be inserted for the purpose of making electrical connection thereto. To maximize utilization of the space within housing 21, crystal 35 may be mounted diagonally in socket 25. It may be seen that socket 25 divides the interior of housing 21 into an upper compartment for containing this crystal. A cover 40 for housing 21 includes dimples 41 which engage corresponding projections 42 in the upper portion of the walls of housing 21 for retaining the cover. A spring member 45 may be used between the top of crystal 35 and the cover 40 in order to retain the crystal firmly in the socket.

Socket 25 also defines a lower chamber within housing 21 which provides space for a thermostat 50. A thermostat cover 52 may be secured in an aperture in the bottom of housing 21, by some means, such as soldering, and thermostat 50 may be inserted from the bottom of housing 21, supported thereby encircling strip 53, and sealed within cover 52 by a cementing compound so that the thermostat is hermetically sealed. A heating coil 55 is wound about the upper chamber formed in housing 21 and is serially connected with thermostat 50 across a pair of the pins 14. A further pair of pins 14 is also connected to the connectors 33 of socket 25 to provide external connecting means for crystal 35. The wire leads to pins 14 will provide some retaining force for housing 21 if this is fastened by cement instead of bracket 27.

Figure 2:
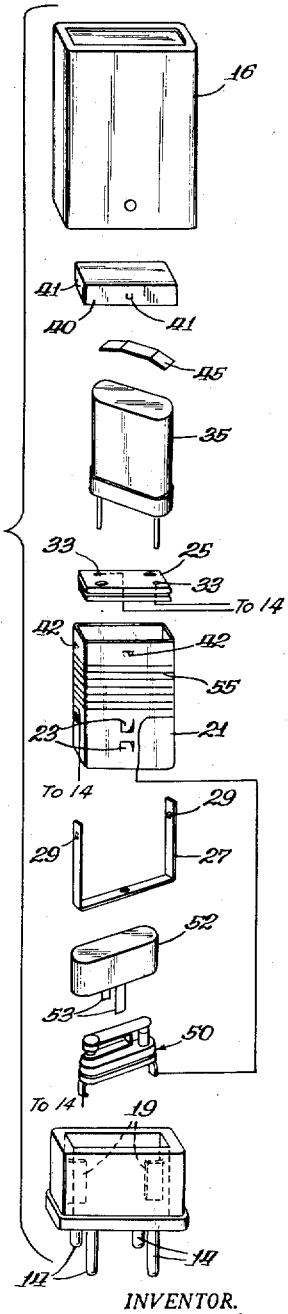
Fig. 2 is an exploded view of the component parts of the housing and oven.

*The cup-like thermostat cover 52 extends inwardly of the inner housing 21 and forms a cavity having an opening facing the recess in base 12. As shown in Fig. 3, one side of the thermostat, namely its base slab, is exposed in the opening of the base 12 into which the ledge portions 18 extend. Also as shown in Figs. 2 and 3, the connecting terminals for the movable element and the fixed terminal of the thermostat extend into the base recess. There is a conductor lead coupled from one thermostat terminal to a pin 14 and the heating coil 55 is directly series connected through the other terminal to the active element of the thermostat 50.*

Thermostat 50 may be constructed so as to complete an electrical circuit to heating coil 55 at a temperature considerably above the highest ambient temperature expected to be encountered during use of the crystal. For example, the thermostat may close at a temperature of 185° F. to cause the heating coil 55 to be energized. This will of course heat the interior of housing 16 as well as the interior of housing 21 in which the crystal 35 is contained. The air space between the two housings will provide some degree of insulation against heat loss from housing 21 to the outside surroundings, particularly when the construction is substantially air tight so that any heat loss would be limited largely to conduction rather than convection around housing 21.

It may also be noted that repair or replacement of the components of the device is particularly simple. Screws 17 secure the outer housing and bolt 31 secures the inner housing permitting easy access to the interior of housing 21 should it be necessary to service the heating portion of the device. However, for merely changing crystals housing 16 and cover 40 can be removed for access to the crystal 35 which simply plugs into its socket 25.

Figure 4:
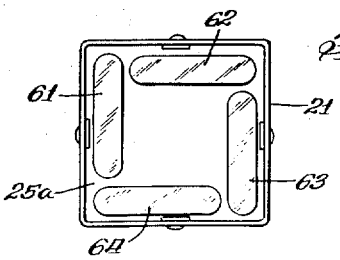
Fig. 4 is a top view of a modified form of a portion of the device.

Fig. 4 shows a top view of the housing 21 in which is supported a socket 25a containing four pairs of connecting apertures for connection to crystals 61–64. These four crystals are shown positioned parallel to the respective walls of housing 21 rather than extending diagonally across the housing as in the construction described in connection with Figs. 1–3. Thus the same size structure may be utilized to house a plurality of smaller crystals by only using a different socket and additional connecting pins on the base of the device. The remainder of the mechanical construction of the embodiment shown in Fig. 4 would be similar to that described above in connection with the other figures.

This invention provides therefore, a crystal oven and housing which is of simple and inexpensive construction. The device may be easily adapted for enclosing crystals of different sizes while at the same time it possesses a compact rectangular form which maximizes the use of allotted space in radio equipment. Furthermore, the device is entirely practical in that it permits comparatively simple access to the crystal or crystals contained therein when it becomes necessary to change them.

I claim:

[1. A piezoelectric crystal oven and housing structure including in combination, a first housing, a second housing supported in said first housing, said second housing having socket means therein defining a first chamber for containing a crystal and a second chamber, a thermostat supported in said second chamber, heating means controlled by said thermostat and disposed adjacent said first chamber for heating a crystal contained therein, and connector means supported by said first housing for making electrical connection to a crystal contained in said first chamber and to said heating means.]

[2. A piezoelectric crystal oven including in combination an inner housing having a socket with coupling means for removably supporting a crystal on one side thereof, a thermostat supported in said inner housing on the other side of said socket, electric heating means supported on said inner housing and adapted to be coupled to said thermostat to be controlled thereby, a base having mounting portions to support said inner housing, and terminal means adapted to be coupled to said coupling means and said heating means to provide electrical connection thereto, and an outer housing adapted to fit over said inner housing and to be secured to said base for protection and heat insulation of said inner housing.]

[3. A piezoelectric crystal oven including in combination an inner housing with a removable cover, a socket supported in said inner housing for supporting a crystal on one side of said socket, a thermostat supported in said inner housing on the other side of said socket, electrical heating means supported on said inner housing and adapted to be coupled to said thermostat to be controlled thereby, a base having mounting portions to support said inner housing and terminal pins adapted to be coupled to said socket and said heating means to provide electrical connection thereto and an outer housing adapted to fit over said inner housing and to be removably secured to said base for protection and heat insulation of said inner housing.]

4. A crystal oven including in combination a rectangular outer housing, a base for closing said outer housing, said base having electrical connecting pins and a recessed portion communicating with said outer housing and a plurality of spaced ledge portions within said recessed portion, a rectangular inner housing adapted to fit snugly within said recessed portion and upon said ledge portions, a bracket member secured to said inner housing, said bracket member extending into said recessed portion and being removably secured to said base, heating means supported by said inner housing and adapted to be electrically connected to said connecting pins for energization thereof, and socket means adapted to be coupled to said connecting pins and contained within said inner housing for support of, and connection to, a crystal.

5. A crystal oven including in combination a rectangular outer housing, a detachable base for closing said outer housing, said base having electrical connecting pins and a recessed portion communicating with said outer housing and a plurality of spaced ledge portions within said recessed portion, a rectangular inner housing adapted to fit snugly within said recessed portion and upon said ledge portions, a removable cover for said inner housing, means securing said inner housing to said ledge portions, heating means supported by said inner housing and adapted to be electrically connected to said connecting pins for energization thereof, socket means adapted to be coupled to said connecting pins and supported by said inner housing for retaining a crystal and a thermostat supported within said inner housing on the side of said socket means opposite that which a crystal is retained.

6. A crystal oven including in combination a rectangular outer housing, a base for closing said outer housing, said base having electrical connecting pins and a recessed portion communicating with said outer housing and a plurality of spaced ledge portions within said recessed portion, a rectangular inner housing adapted to fit snugly within said recessed portion and upon said ledge portions, means securing said inner housing against said ledge portions, a heating coil supported by said inner housing and electrically connected to said connecting pins for energization thereof, a thermostat supported in the bottom of said inner housing and coupled to a connecting pin and to said heating coil for control of current supplied to said heating coil, and a crystal socket coupled to said connecting pins and supported within said inner housing by means of lug portions in the walls thereof.

*7. A crystal housing and oven including in combination an outer housing, a base for closing said outer housing, said base having a plurality of electrical connecting pins and a recessed portion communicating with said outer housing and a plurality of spaced ledge portions within said recessed portion, an inner housing adapted to fit snugly within said recessed portion and upon said ledge portions, means securing said inner housing upon said ledge portions, said inner housing having an inwardly extending cup forming a cavity with an opening therein facing said recessed portion, a thermostat supported in said cup of said inner housing with one side thereof exposed to said recessed portion and having electrical terminals extending into said recessed portion, a heating coil supported by said inner housing and electrically connected directly to one of said connecting pins and to one of said terminals, a conductor directly interconnecting another of said terminals and another of said connecting pins, and a crystal socket coupled to others of said connecting pins and supported within said inner housing spaced from said cup thereof.*

*8. A crystal housing and oven including in combination a rectangular outer housing, a base for closing said outer housing, said base having a plurality of electrical connecting pins and a recessed portion communicating with said outer housing and a plurality of spaced ledge portions within said recessed portion, a rectangular inner housing adapted to fit snugly within said recessed portion and upon said ledge portions, said inner housing having an inwardly extending cup forming a cavity with an opening therein facing said recessed portion, a thermostat supported in said cup of said inner housing and having a base member with electrical terminals exposed within said recessed portion, a heating coil supported by said inner housing and conductively connected directly to one of said connecting pins and to one of said terminals, a conductor lead directly interconnecting another of said terminals and another of said connecting pins, and a crystal supporting socket coupled to others of said connecting pins and supported within said inner housing spaced from said cup thereof.*

*9. A crystal housing and oven including in combination a rectangular outer housing, an insulating base for closing said outer housing, said base having a plurality of electrical connecting pins and a recessed portion communicating with said outer housing and a plurality of spaced ledge portions within said recessed portion, a rectangular inner housing adapted to fit snugly within said recessed portion and upon said ledge portions, said inner housing having a removable cover and a spring member carried thereby for engaging a crystal enclosed within said inner housing, detachable means engaging the exterior of said inner housing for securing said inner housing upon said ledge portions, said inner housing having a bottom with an inwardly extending cup with an opening therein facing said recessed portion, a thermostat supported in said cup of said inner housing with one side thereof exposed to said recessed portion and having electrical terminals extending into said recessed portion, a heating coil supported by said inner housing and conductively connected directly to one of said connecting pins and to one of said terminals, a conductor lead directly interconnecting another of said terminals and another of said connecting pins, and a crystal socket coupled to others of said connecting pins and supported within said inner housing spaced from said cup thereof.*

References Cited in the file of this patent or the original patent

UNITED STATES PATENTS

| | | |
|---|---|---|
| 1,996,569 | Byrnes et al. | Apr. 2, 1935 |
| 2,102,783 | Bokovoy | Dec. 21, 1937 |
| 2,131,826 | Thomas | Oct. 4, 1938 |
| 2,203,545 | Peterson | June 4, 1940 |
| 2,556,865 | Baldwin | June 12, 1951 |
| 2,607,818 | Richards | Aug. 19, 1952 |
| 2,651,731 | Overbey et al. | Sept. 8, 1953 |
| 2,676,274 | Kobayashi | Apr. 20, 1954 |
| 2,747,069 | Miller | May 22, 1956 |

OTHER REFERENCES

JK09 Assembly, The James Knight Co., Sandwich, Ill., K90X01, May 28, 1954.